(12) United States Patent
Jeong et al.

(10) Patent No.: US 8,174,015 B2
(45) Date of Patent: May 8, 2012

(54) DISPLAY DEVICE AND MANUFACTURING METHOD THEREOF

(75) Inventors: Ki-Hun Jeong, Cheongan-si (KR);
Byeong-Hoon Cho, Seoul (KR);
Jung-Suk Bang, Guri-si (KR);
Sang-Youn Han, Seoul (KR);
Woong-Kwon Kim, Cheonan-si (KR);
Sung-Hoon Yang, Seoul (KR); Suk Won Jung, Goyang-si (KR); Dae-Cheol Kim, Suwon-si (KR); Kyung-Sook Jeon, Yongin-si (KR); Seung Mi Seo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 142 days.

(21) Appl. No.: 12/761,958

(22) Filed: Apr. 16, 2010

(65) Prior Publication Data

US 2011/0057189 A1 Mar. 10, 2011

(30) Foreign Application Priority Data

Sep. 8, 2009 (KR) .................. 10-2009-0084545

(51) Int. Cl.
*H01L 29/04* (2006.01)

(52) U.S. Cl. .... 257/59; 257/347; 257/443; 257/E33.004

(58) Field of Classification Search .................. 257/59, 257/347, 443–444, 918, E33.004, E33.077
See application file for complete search history.

(56) References Cited

U.S. PATENT DOCUMENTS

| | | | | |
|---|---|---|---|---|
| 5,723,878 A | * | 3/1998 | Yanai | 257/59 |
| 6,524,876 B1 | * | 2/2003 | Baek et al. | 438/48 |
| 6,833,883 B2 | * | 12/2004 | Park et al. | 349/43 |
| 7,286,173 B2 | | 10/2007 | Zhang et al. | |
| 7,915,614 B2 | * | 3/2011 | Shin et al. | 257/59 |
| 2001/0019125 A1 | * | 9/2001 | Hong et al. | 257/59 |
| 2008/0142920 A1 | | 6/2008 | Tai et al. | |

FOREIGN PATENT DOCUMENTS

| | | |
|---|---|---|
| JP | 2008-171871 | 7/2008 |
| JP | 2008-306080 | 12/2008 |
| JP | 2009-010125 | 1/2009 |
| JP | 2009-016855 | 1/2009 |

(Continued)

*Primary Examiner* — Thanh Nguyen
(74) *Attorney, Agent, or Firm* — H.C. Park & Associates, PLC

(57) ABSTRACT

A display device includes a lower panel including a lower substrate and a pixel transistor formed on the lower substrate; and an upper panel facing the lower panel, and including an upper substrate, a sensing transistor formed on the upper substrate, and a readout transistor connected to the sensing transistor and transmitting a signal. The readout transistor includes a first lower gate electrode formed on the upper substrate, a first semiconductor layer formed on the first lower gate electrode and overlaps the first gate electrode, and a first source electrode and a first drain electrode disposed on the first semiconductor layer. The sensing transistor includes a light blocking film disposed on the upper substrate, a second lower gate electrode contacting the light blocking film on the light blocking film, a second semiconductor layer overlapping the light blocking film on the second lower gate electrode, a second source electrode and a second drain electrode formed on the second semiconductor layer, and a second upper gate electrode overlapping the second semiconductor layer on the second source electrode and the second drain electrode.

10 Claims, 23 Drawing Sheets

FOREIGN PATENT DOCUMENTS

| | | |
|---|---|---|
| JP | 2009-093050 | 4/2009 |
| KR | 1020060132372 | 12/2006 |
| KR | 1020080000768 | 1/2008 |
| KR | 1020080107221 | 12/2008 |
| KR | 1020090004282 | 1/2009 |
| KR | 1020090030979 | 3/2009 |

\* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2009-0084545 filed on Sep. 8, 2009, which is hereby incorporated by reference for all purposes as if fully set forth herein.

BACKGROUND OF THE INVENTION

1. Field of the Invention

Exemplary embodiments of the present invention relate to a display device and a manufacturing method thereof.

2. Description of the Background

Currently, various flat panel displays can provide a user with displays that are lighter and much thinner. Examples of displays include a liquid crystal display that is widely used as a flat panel display.

Additionally, the liquid crystal display can include a sensing device having a touch sensing function or an image sensing function. However, the conventional sensing device mostly adopting a sensing function or an image sensing function by detecting physical changes applied to the display such that it is difficult to obtain high reliability.

Therefore, there is a need of a display device capable of a reliable sensing function.

SUMMARY OF THE INVENTION

These and other needs are addressed by the present invention, in which exemplary embodiments provide a display device and a manufacturing method for making a high-reliability display having a sensing function.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a display device that includes a panel having an upper substrate and a lower substrate, and a pixel transistor is formed on the lower substrate. The upper substrate is facing the lower substrate and an infrared ray sensing transistor and a readout transistor being connected to the infrared ray sensing transistor are provided on the upper substrate, and the readout transistor is provided to transmit a signal. The readout transistor comprises a first lower gate electrode formed on the upper substrate, and a first semiconductor layer overlapping the first lower gate electrode is formed on the first lower gate electrode, and a first source electrode and a first drain electrode are formed on the first semiconductor layer. And the infrared ray sensing transistor comprises a light blocking film and a second lower gate electrode formed on the upper substrate the second lower gate coupled to the light blocking film, a second semiconductor layer overlapping the light blocking film formed on the second lower gate electrode, a second source electrode and a second drain electrode formed on the second semiconductor layer, and a second upper gate electrode overlapping the second semiconductor layer formed on the second source electrode and the second drain electrode.

Exemplary embodiments of the present invention disclose a method for manufacturing a display device. The method includes forming a first semiconductor material and an etching preventing material sequentially on a substrate. The method also includes etching the first semiconductor material and the etching preventing material to form a first semiconductor layer and an etching preventing layer for providing a readout transistor. The method includes forming a second semiconductor material sequentially on the substrate and the etching preventing layer. The method also includes etching the second semiconductor material to form a second semiconductor layer for providing an infrared ray sensing transistor. The method includes forming a first source electrode and a first drain electrode on the substrate and the first semiconductor layer, and forming a second source electrode and a second drain electrode on the substrate and the second semiconductor layer. The method also includes forming a gate insulating layer on the first source electrode and the first drain electrode, and the second source electrode and the second drain electrode.

Exemplary embodiments of the present invention disclose a method for manufacturing a display device. The method includes forming a first semiconductor material and an etching preventing material sequentially on a substrate. The method also includes etching the first semiconductor material and the etching preventing material to form a first semiconductor layer and an etching preventing layer of an infrared ray sensing transistor. The method includes forming a second semiconductor material sequentially on the substrate and the etching preventing layer. The method further includes etching the second semiconductor material to form a third semiconductor layer of a visible ray sensing transistor. The method includes forming a third source electrode and a third drain electrode on the substrate and the third semiconductor layer, and a first source electrode and a first drain electrode on the substrate and the first semiconductor layer. The method also includes forming a gate insulating layer on the third source electrode and the third drain electrode, and the first source electrode and the first drain electrode.

According to exemplary embodiments of the present invention, the infrared ray sensing transistor may have a semiconductor layer made of amorphous silicon-germanium or amorphous germanium, and the visible ray sensing transistor and the readout transistor can include a semiconductor layer made of amorphous silicon, such that the infrared ray sensitivity of the infrared ray sensing transistor may be improved, and the processing speed of the readout transistor may be simultaneously improved while the visible ray sensitivity of the visible ray sensing transistor is improved, and thereby the transistor may be used as an appropriate objects of infrared ray sensing, visible ray sensing, and control thereof.

Also, the semiconductor layer of the infrared ray sensing transistor may include amorphous silicon-germanium or amorphous germanium, the visible ray sensing transistor and the readout transistor may include amorphous silicon, and the etching preventing layer can be formed on the semiconductor layer such that damage to the semiconductor layer of the transistor may be prevented during the manufacturing process and thereby the characteristics of the transistor may be improved.

Also, the thickness of the semiconductor layer of the infrared ray sensing transistor can be increased for increasing the infrared ray sensitivity, and the thickness of the blocking insulating layer formed between the semiconductor layer and the light blocking film of the infrared ray sensing transistor can be increased for minimizing the change of Id and Iir such that the minimum change of the infrared ray sensitivity may be maintained.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 4, FIG. 5 and FIG. 6 are graphs depicting a result of measuring infrared ray sensitivity of an infrared ray sensing transistor TrI in a structure in which a light blocking film and an upper gate electrode are synchronized in which FIG. 4 depicts a semiconductor layer with a thickness of 1000 Å, FIG. 5 depicts a semiconductor layer with a thickness of 3000 Å, and FIG. 6 depicts a semiconductor layer with a thickness of 5000 Å.

DETAILED DESCRIPTION OF THE ILLUSTRATED EMBODIMENTS

An apparatus, method of display device and manufacturing method thereof. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
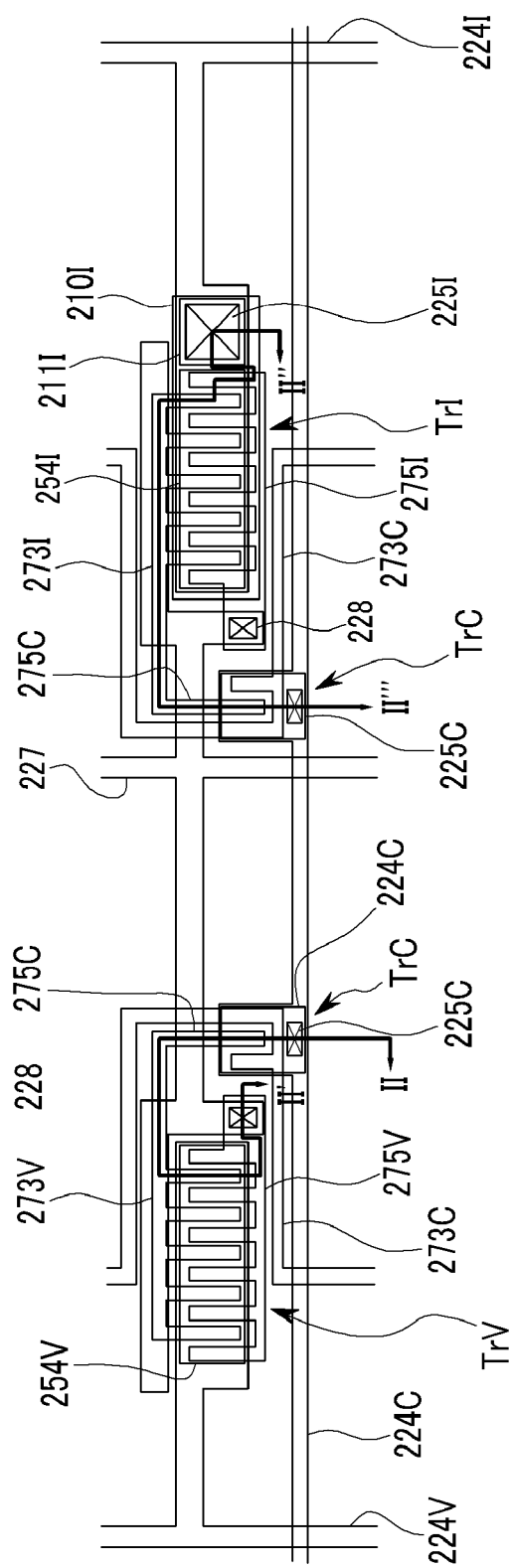
FIG. 1 is a layout view of an upper substrate of a display device, according to exemplary embodiments of the present invention.
Figure 2:
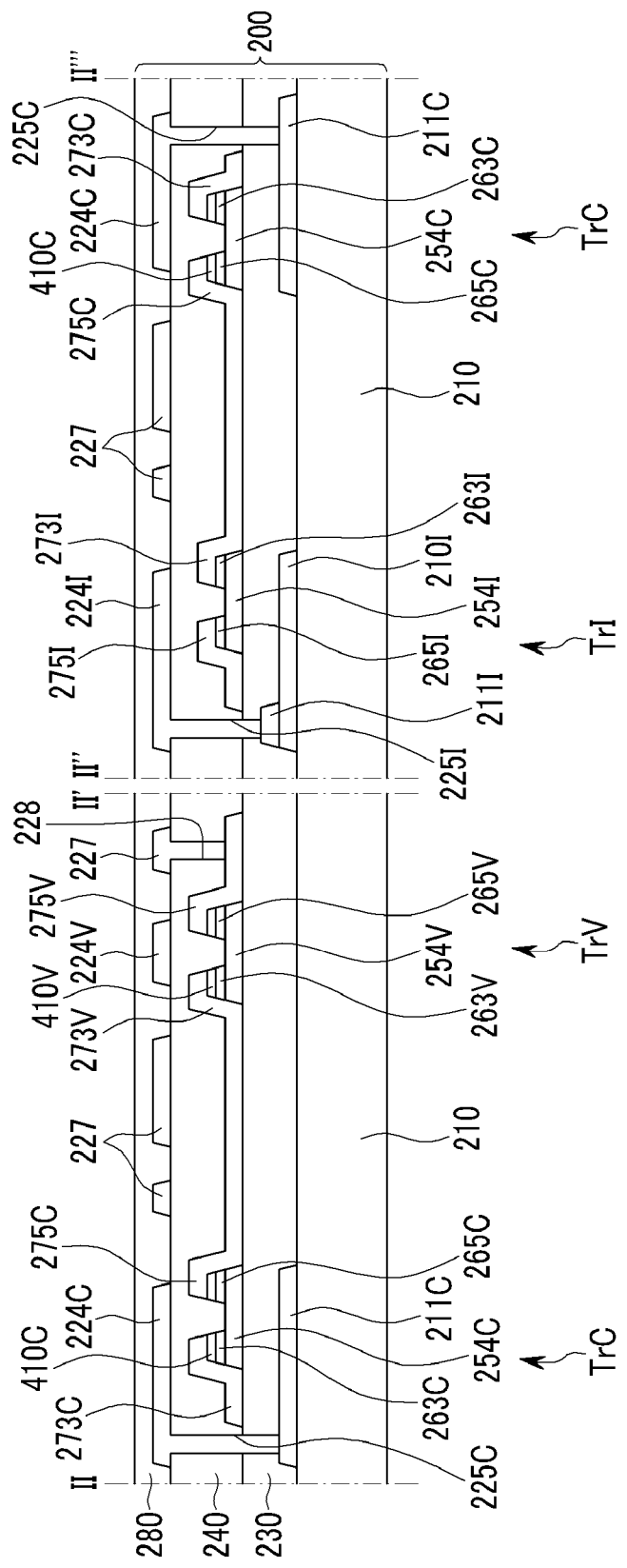
FIG. 2 is a cross-sectional view taken along the lines II-II' and II"-II"' of FIG. 1.

Now, a display device according to exemplary embodiments of the present invention is described with reference to FIG. 1 and FIG. 2. FIG. 1 and FIG. 2 show a liquid crystal display, however the present exemplary embodiment may be applied to various other display devices.

FIG. 1 is a layout view of an upper substrate of a display device according to exemplary embodiments of the present invention, and FIG. 2 is a cross-sectional view taken along the lines II-II' and II"-II"' of FIG. 1.

As shown in FIG. 1 and FIG. 2, an upper panel 200 may include an upper substrate 210 made of transparent glass or plastic, and sensing transistors TrI and TrV. The sensing transistors TrI and TrV may include at least one infrared ray sensing transistor TrI and at least one visible ray sensing transistor TrV. The infrared ray sensing transistor TrI and the visible ray sensing transistor TrV may be uniformly distributed on the whole upper panel 200 to sense infrared rays and visible rays on the entire upper panel 200. As examples, the infrared ray sensing TrI and the visible ray sensing TrV may be alternatively arranged, may be arranged in disorder, and may be arranged in a predetermined ratio.

The upper panel 200 may further include a readout transistor TrC connected to the infrared ray sensing transistor TrI and the visible light sensing transistor TrV and transmitting a detected signal. As such, the readout transistor TrC may be disposed with the same layer as the sensing transistors TrI and TrV, and close thereto.

The infrared sensing transistor TrI, the visible light sensing transistor TrV, and the readout transistor TrC may be disposed on the upper substrate 210.

For example, the infrared sensing transistor TrI may include a semiconductor layer 254I, ohmic contact layers 263I and 265I, a source electrode 273I, a drain electrode 275I, a gate insulating layer 240, and a gate electrode 224I.

A light blocking film 210I can be disposed on the upper substrate 210, and can overlap the semiconductor layer 254I. The light blocking film 210I can prevent the semiconductor layer 254I from being exposed to visible rays. Accordingly, the light blocking film 210I may include a material that blocks the visible rays provided from the outside of the liquid crystal display. For example, the light blocking film 210I may include an organic material, amorphous silicon, amorphous silicon-germanium, or amorphous germanium including black pigments.

The light blocking film 210I blocks visible rays that are incident to the liquid crystal display from the outside to improve the signal-to-noise ratio (SNR) of the signal and the noise, and to minimize the sensitivity of the semiconductor layer 254I including the amorphous silicon-germanium or amorphous germanium to the infrared ray region such that the influence of the visible rays may be efficiently prevented.

A lower gate electrode 211I is disposed on a portion of the light blocking film 210I. A blocking insulating layer 230 covering the lower gate electrode 211I and including an insulating material such as silicon nitride is formed on the upper substrate 210. The thickness of the blocking insulating layer 230 is preferably in the range of 3000 Å to 10,000 Å. When the thickness of the blocking insulating layer 230 is less than 3000 Å, the change of the infrared ray sensitivity is large according to the change of the Vgs such that the changing of the characteristic curve of the infrared ray sensing transistor is large due to stimulation of the usage time, and when the thickness of the blocking insulating layer 230 is larger than about 10,000 Å, the transistor may not be down-sized. This will be described with reference to an experimental result.

Figure 3:
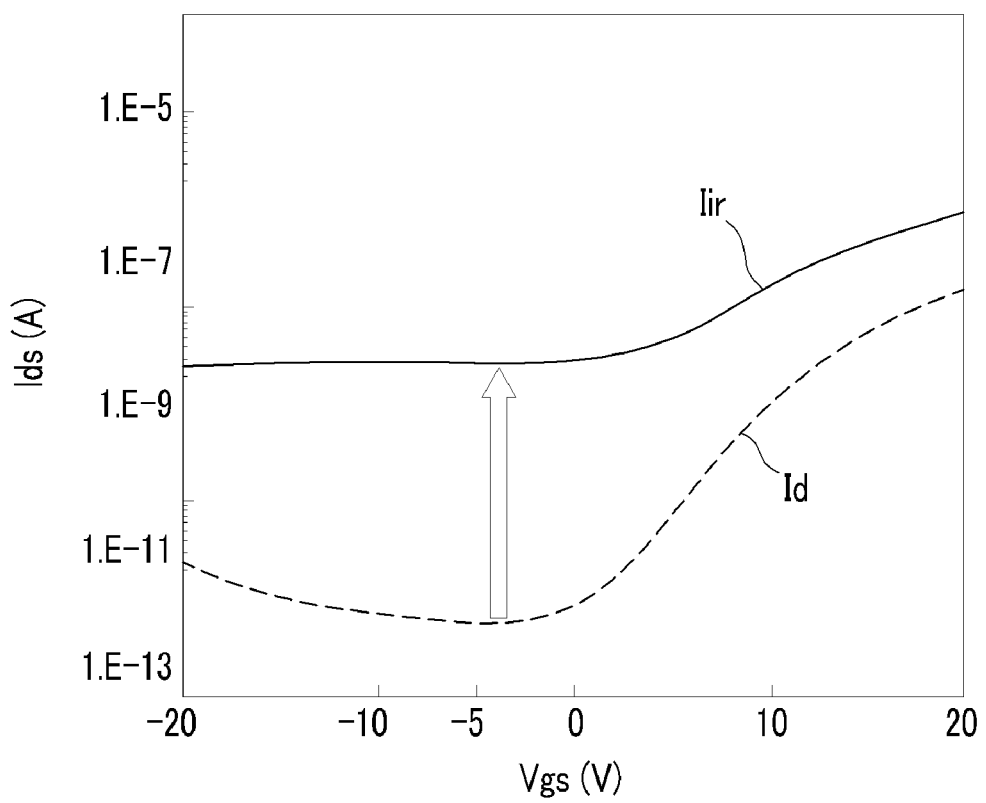
FIG. 3 is a graph depicting a result of measuring infrared ray sensitivity of an infrared ray sensing transistor TrI in a structure in which a light blocking film and an upper gate electrode are synchronized in which a blocking insulating layer is formed with a thickness of about 4500 Å.

FIG. 3 is a graph depicting a result of measuring infrared ray sensitivity of an infrared ray sensing transistor TrI in a structure in which a light blocking film and an upper gate electrode are synchronized in a case in which the blocking insulating layer is formed with a thickness of about 4500 Å. In FIG. 3, the thickness of the semiconductor layer is approximately 5000 Å, the thickness of the ohmic contact layers 263I and 265I is approximately 500 Å, the value of twenty infrared ray sensing transistors including the semiconductor layer can be measured, the width of one semiconductor layer is approximately 460 μm, and the length thereof is approximately 5.5 μm.

As shown in FIG. 3, when the semiconductor layer is not exposed to the infrared rays in the range of −20V to 0V of Vgs, the change of the generated current Id is very small. This is the reason Id is low when Vgs is about −20V. When the thickness of the blocking insulating layer is large, the injection amount of the charge of Vgs being about −20V can be decreased such that the conductivity of the channel of the semiconductor layer is decreased, and as a result, Id in the case of Vgs about −20V is decreased. Accordingly, the change of the infrared ray sensitivity according to the change of Vgs as the voltage can be applied to the light blocking film that is minimized such that the infrared ray sensing margin of the infrared ray sensing transistor may be increased. Accordingly, the influence by changing of the characteristic curve of the infrared ray sensing transistor due to the usage time accumulation may be reduced on the infrared ray sensing.

The semiconductor layer 254I can be disposed on the blocking insulating layer 230, and may include amorphous silicon-germanium or amorphous germanium. When the semiconductor layer 254I includes amorphous silicon-germanium or amorphous germanium, an infrared ray sensing transistor TrI having excellent infrared ray sensitivity may be manufactured. It is noted that the thickness of the semiconductor layer 254I is in the range of 3000 Å to 10m000 Å. When the thickness is less than about 3000 Å, the infrared ray sensitivity is decreased. Alternatively, when the thickness is more than about 10,000 Å, the transistor may not be down-sized. This will be described with reference to an experimental result.

Figure 4:
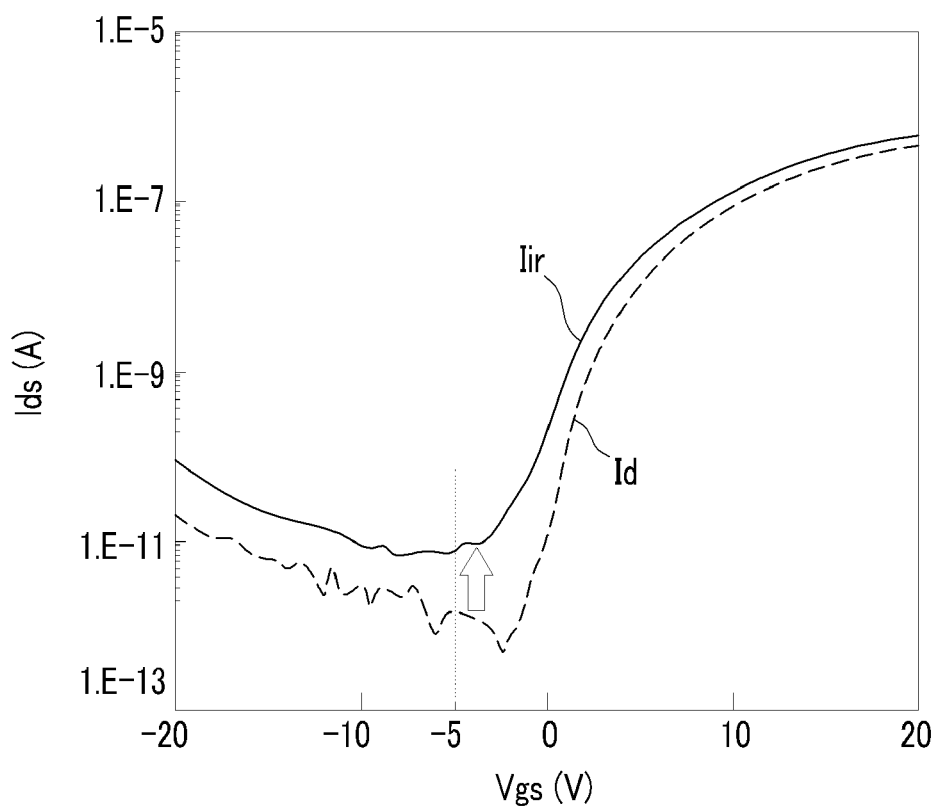
Figure 5:
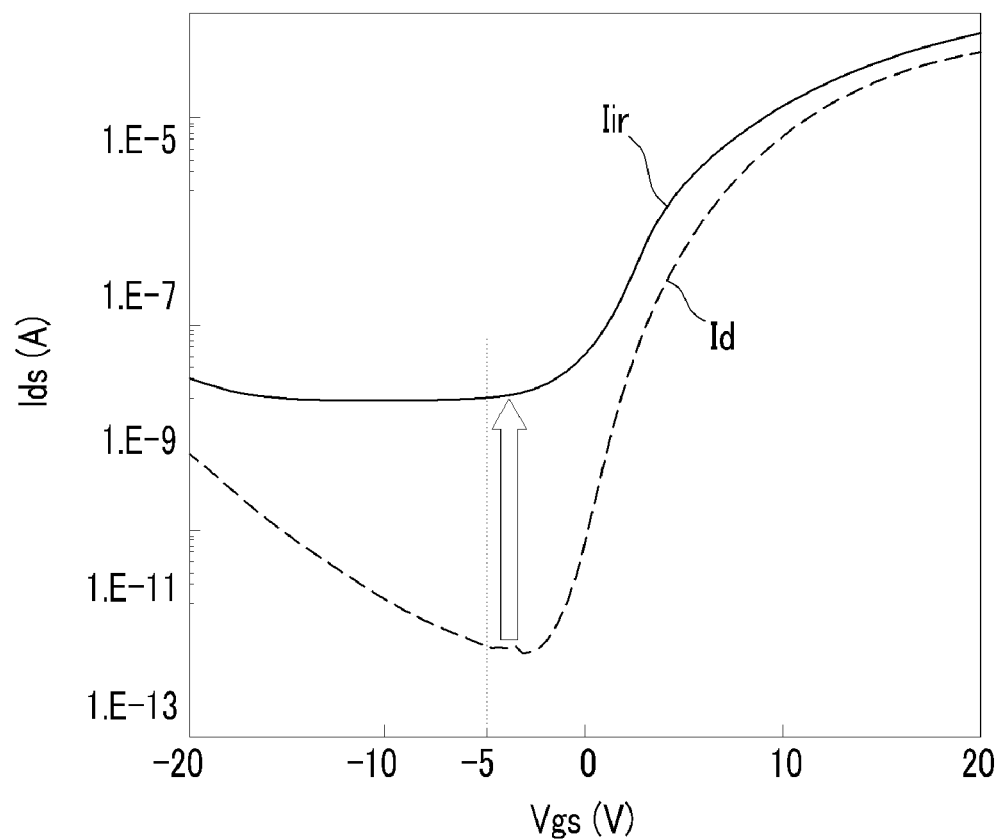
Figure 6:
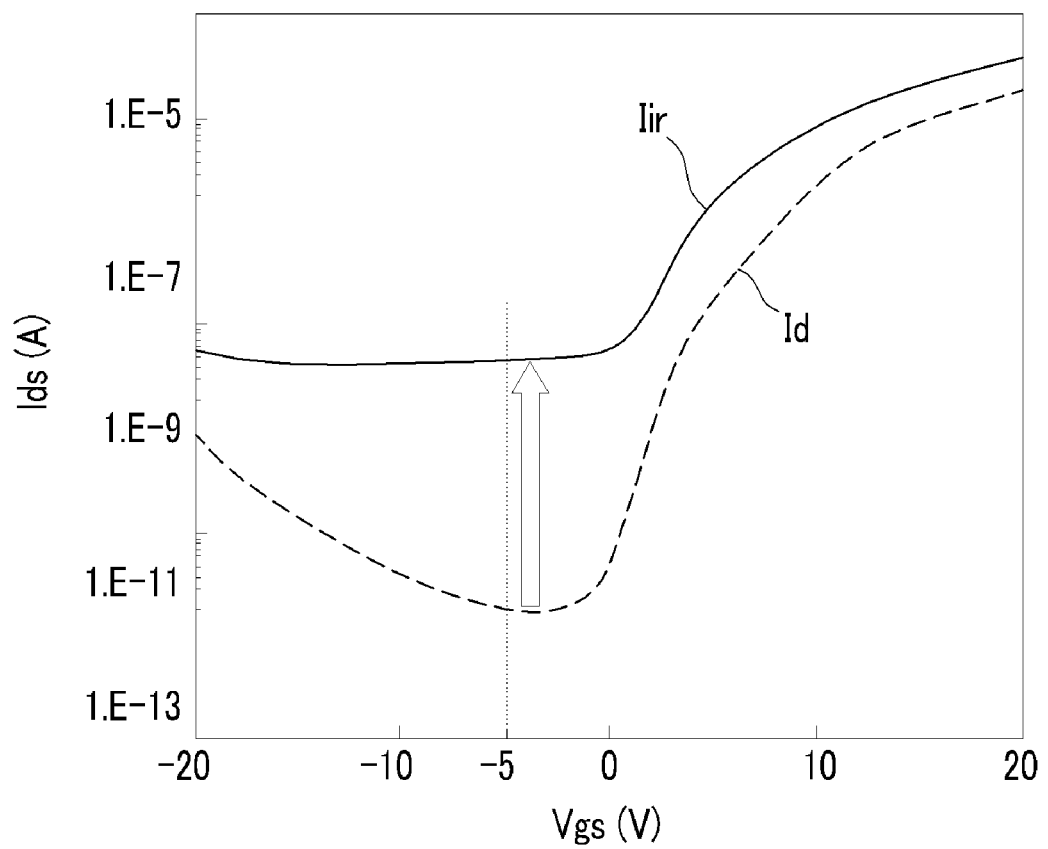

FIG. 4, FIG. 5 and FIG. 6 are graphs depicting a result of measuring infrared ray sensitivity of an infrared ray sensing transistor TrI in a structure in which a light blocking film and an upper gate electrode are synchronized in which FIG. 4 is a case of a semiconductor layer with a thickness of 1000 Å, FIG. 5 depicts a semiconductor layer with a thickness of 3000 Å, and FIG. 6 depicts a semiconductor layer with a thickness of 5000 Å. In FIG. 4, FIG. 5 and FIG. 6, the thickness of the blocking insulating layer is approximately 2000 Å, the thickness of the ohmic contact layers 263I and 265I is approximately 500 Å, the value is measured for the semiconductor layer of one infrared ray sensing transistor, the width of the semiconductor layer is approximately 50 μm, and the length thereof is approximately 8 μm.

As shown in FIG. 4, FIG. 5 and FIG. 6, the infrared ray sensitivity of the case in which the thickness of the semiconductor layer is approximately 3000 Å or approximately 5000 Å that is increased more than about 10 times that of the infrared ray sensitivity of the case in which the thickness of the semiconductor layer is approximately 1000 Å. In this example, when the thickness of the semiconductor layer is approximately 3000 Å or approximately 5000 Å, the current Iir generated by the reaction to the infrared rays can be uniformly maintained in the range of −20V to 0V of Vgs, and this can be achieved because the amount of electron-hole pairs generated by the reaction to the infrared ray is increased when the thickness of the semiconductor layer is increased to approximately 3000 Å.

On the other hand, as shown in FIG. 1 and FIG. 2, the ohmic contact layers 263I and 265I may be disposed on the semiconductor layer 254I. The source electrode 273I can be disposed on the ohmic contact layer 263I. The drain electrode 275I may be separated from the source electrode 273I on the ohmic contact layer 265I.

The gate insulating layer 240 may cover the semiconductor layer 254I, the source electrode 273I, and the drain electrode 275I. The gate insulating layer 240 may have a contact hole 225I through which the lower gate electrode 211I is connected to the upper gate electrode 224I. It is noted that the thickness of the gate insulating layer 240 is in the range of approximately 3000 Å to approximately 10,000 Å. When the thickness is less than 3000 Å, the infrared ray sensitivity is decreased, and when the thickness is more than 10,000 Å, the transistor may not be down-sized.

The upper gate electrode 224I may overlap the semiconductor layer 254I of the gate insulating layer 240, and can be connected to the lower gate electrode 211I through the contact hole 225I.

The light blocking film 210I may contact the lower gate electrode 211I connected to the upper gate electrode 224I such that an operation error of the transistor by the light blocking film 210I may be prevented. It is observed that when the light blocking film 210I made of amorphous silicon is separated therefrom, the light blocking film 210I can absorb external light thereby generating minute charges, and consequently the operation of the transistor may be influenced. Accordingly, the light blocking film 210I can be connected to the upper gate electrode 224I through the lower gate electrode 211I such that the light blocking film 201I can be applied with the gate voltage having a predetermined magnitude, and thereby the operation error of the transistor by the light blocking film 210I may be prevented.

A passivation layer 280 is provided to protect the gate electrode 224I that is formed on the upper gate electrode 224I.

The readout transistor TrC may be connected to the source electrode 273I of the infrared ray sensing transistor TrI through the drain electrode 275C.

The readout transistor TrC may include a semiconductor layer 254C, ohmic contact layers 263C and 265C, a source electrode 273C, a drain electrode 275C, a gate insulating layer 240, a lower gate electrode 211C, and an upper gate electrode 224C.

The lower gate electrode 211C can be disposed on the upper substrate 210, and the lower gate electrode 211C can overlap the semiconductor layer 254C. The blocking insulating layer 230 including an insulating material such as silicon nitride can be formed on the upper substrate 210, thereby covering the lower gate electrode 211C.

The semiconductor layer 254C disposed on the blocking insulating layer 230 may include amorphous silicon. By way of example, the thickness of the semiconductor layer 254C is in the range of 500 Å to 3000 Å. It is observed that when the thickness is less than 500 Å, it is difficult for the channel to be uniform, and when the thickness is more than 3000 Å, the transistor may not be down-sized.

The ohmic contact layers 263C and 265C may be disposed on the semiconductor layer 254C. The source electrode 273C may be disposed on the ohmic contact layer 263C. The drain electrode 275C may be separated from the source electrode 273C on the ohmic contact layer 265C.

An etching preventing layer 410C may be formed between the ohmic contact layer 263C and the source electrode 273C, and the ohmic contact layer 265C and the drain electrode 275C. The etching preventing layer 410C may be formed on the ohmic contact layers 263C and 265C on the semiconductor layer 254C to prevent damage to the semiconductor layer 254C of the readout transistor TrC when forming the semiconductor layer 254I of the infrared ray sensing transistor TrI. The etching preventing layer 410C may include one selected from Mo, Cr, MoAlMo, MoAl, IZO, or ITO.

The gate insulating layer 240 may be disposed on the semiconductor layer 254C, the source electrode 273C, and the drain electrode 275C. The gate insulating layer 240 may have a contact hole 225C for connecting the lower gate electrode 211C to the upper gate electrode 224C.

The upper gate electrode 224C may overlap the semiconductor layer 254C on the gate insulating layer 240, and can be connected to the lower gate electrode 211C through the contact hole 225C. The upper gate electrode 224C may prevent the semiconductor layer 254C from being exposed to visible rays.

The passivation layer 280 is provided to protect the upper gate electrode 224C may be formed on the upper gate electrode 224C.

On the other hand, a visible ray sensing transistor TrV sensing visible rays can be disposed on the upper substrate 210, and the readout transistor TrC electrically connected to the visible ray sensing transistor TrV can be formed with the same layer as the visible ray sensing transistor TrV.

For example, the visible light sensing transistor TrV may include a semiconductor layer 254V, ohmic contact layers 263V and 265V, a source electrode 273V, a drain electrode 275V, a gate insulating layer 240, and a gate electrode 224V.

A blocking insulating layer 230 including the insulating material such as silicon nitride can be formed on the upper substrate 210, and the semiconductor layer 254V made of amorphous silicon can be formed on the blocking insulating layer 230. It is noted that the thickness of the semiconductor layer 254C is in the range of 500 Å to 3000 Å. It should be understood that the thickness is less than 500 Å, it is difficult for the channel to be uniform, and when the thickness is more than 3000 Å, the transistor may not be down-sized.

The ohmic contact layers 263V and 265V may be disposed on the semiconductor layer 254V. The source electrode 273V may be disposed on the ohmic contact layer 263V. The drain electrode 275V may be separated from the source electrode 273V on the ohmic contact layer 265V.

An etching preventing layer 410V can be formed between the ohmic contact layer 263V and the source electrode 273V, and the ohmic contact layer 265V and the drain electrode 275V. The etching preventing layer 410V may be formed on the ohmic contact layers 263V and 265V on the semiconductor layer 254V to prevent damage to the semiconductor layer 254V of the visible ray sensing transistor TrV when forming the semiconductor layer 254I of the infrared ray sensing transistor TrI. The etching preventing layer 410V may include one selected from Mo, Cr, MoAlMo, MoAl, IZO, and ITO.

The gate insulating layer 240 may cover the semiconductor layer 254V, the source electrode 273V, and the drain electrode 275V. The gate insulating layer 240 has a contact hole 228 to connect the drain electrode 275V to the storage electrode 227.

The gate electrode 224V may overlap the semiconductor layer 254V on the gate insulating layer 240. The passivation layer 280 to protect the upper gate electrode 224V may be formed on the upper gate electrode 224V.

The readout transistor TrC may be connected to the source electrode 273V of the visible ray sensing transistor TrV through the drain electrode 275C.

Figure 7:
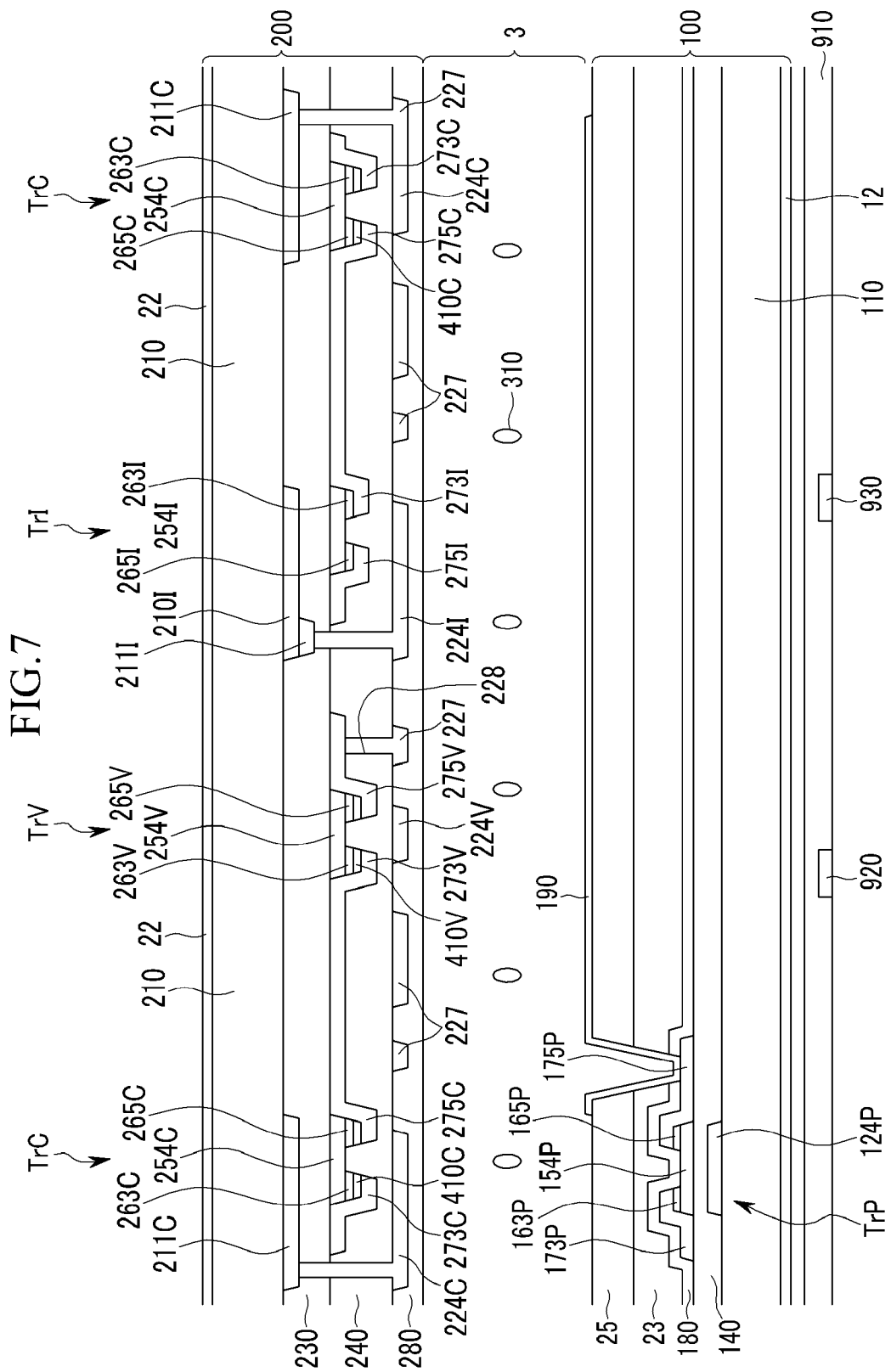
FIG. 7 is a cross-sectional view of a display device, according to exemplary embodiments of the present invention.

FIG. 7 is a cross-sectional view of a display device, according to exemplary embodiments of the present invention.

As shown in FIG. 7, a display device includes a lower panel 100 and an upper panel 200 facing each other, and a liquid crystal layer 3 interposed between the two display panels 100 and 200.

The liquid crystal layer 3 may have negative dielectric anisotropy, and liquid crystal molecules of the liquid crystal layer 3 may be aligned such that their major axes are substantially perpendicular to the surfaces of the two display panels when an electric field is not applied.

Alignment layers (not shown) may be formed on the inner surfaces of the display panels 100 and 200, and they may be vertical alignment layers.

The display device may further include a lower polarizer 12 disposed under the lower panel 100 and an upper polarizer 22 disposed on the upper panel 200. The intensity of the light provided to the lower panel 100 and the upper panel 200 may be controlled by using the polarization characteristics of the lower polarizer 12 and the upper polarizer 22.

The display device may further include a backlight unit 910 disposed under the lower panel 100. The backlight unit 910 includes at least one infrared ray emitting member 920 and at least one visible ray emitting member 930. The infrared ray emitting member 920 and the visible ray emitting member 930 may be point light sources such as light-emitting devices (LEDs). Also, the infrared rays and the visible rays may respectively be emitted from the infrared ray emitting member 920 and the visible ray emitting member 930 may be perpendicularly incident to the lower panel.

The infrared ray emitting member 920 and the visible ray emitting member 930 may be uniformly distributed on the whole backlight unit 910 to provide the infrared rays and the visible rays to the whole backlight unit 910. In some examples, the infrared ray emitting member 920 and the visible ray emitting member 930 may be alternately arranged, may be disorderly arranged, and may be arranged in a predetermined ratio.

The lower panel 100 may include a lower substrate 110 made of transparent glass or plastic and a pixel transistor TrP disposed on the lower substrate 110. The pixel transistor TrP may include a gate electrode 124P formed on the lower substrate 110, a gate insulating layer 140 covering the lower substrate 110 and the gate electrode 124P, a semiconductor layer 154P overlapping the gate electrode 124P and disposed on the gate insulating layer 140, ohmic contact layers 163P and 165P disposed on the semiconductor layer 154P, a source electrode 173P disposed on the ohmic contact layer 163P, and a drain electrode 175P separated from the source electrode 173P on the ohmic contact layer 165P.

The lower panel 100 may further include a gate line disposed on the lower substrate 110 and a data line intersecting the gate line. In this example, the gate line may be connected to the gate electrode 124P of the pixel transistor TrP. Also, the data line may be connected to the source electrode 173P of the pixel transistor TrP.

The lower panel 100 may further include a passivation layer 180 covering the pixel transistor TrP, a color filter 23 disposed on the passivation layer 180, an overcoat 25 disposed on the color filter 23, and a pixel electrode 190 disposed on the overcoat 25. In this example, the pixel electrode 190 may be connected to the drain electrode 175P of the pixel transistor TrP while passing through the overcoat 25 and the passivation layer 180.

Figure 8:
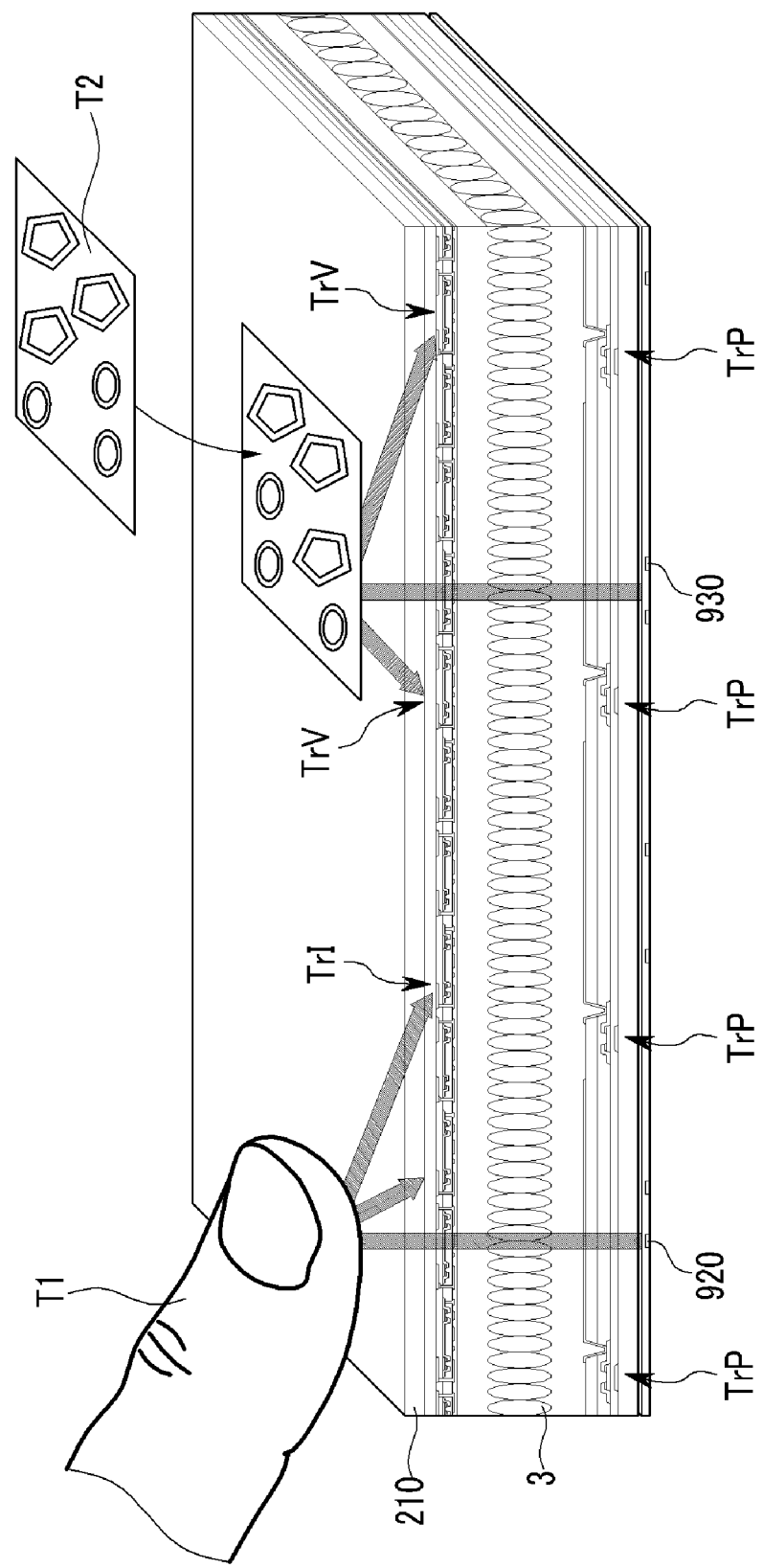
FIG. 8 is a view for illustrating a method for sensing an object by using the display device of FIG. 7.

FIG. 8 is a view for illustrating a method for sensing an object by using the display device of FIG. 7.

As shown in FIG. 8, infrared rays and visible rays can be generated in the backlight unit 910. The infrared rays sequentially pass the lower polarizer 12, the lower panel 100, the liquid crystal layer 3, the upper panel 200, and the upper polarizer 22.

The visible rays may sequentially pass the lower polarizer 12, the lower panel 100, the liquid crystal layer 3, the upper panel 200, and the upper polarizer 22. In this example, the visible rays may be changed into visible rays having various colors by the color filter 23 of the lower panel 100.

For touch sensing of a first object T1 positioned on the liquid crystal display, the infrared rays provided from the backlight unit 910 may be used. When the first object T1 may close to the liquid crystal display, the infrared rays emitted from the liquid crystal display can be reflected by the first object T1. The reflected infrared rays are incident to and detected by the infrared ray sensor TrI positioned in the upper panel 200. Accordingly, the touch sensing for the first object T1 can be executed thereby obtaining the existence of the contact of the first object T1, the position of the contact, and the contact information for the shape and size thereof.

When a gray of visible light emitted from the liquid crystal display is brighter than a gray of visible light incident to the liquid crystal display from the outside, the visible light emitted from the liquid crystal display may be used for image sensing during image sensing of a second object T2 close to the liquid crystal display. In some examples, the visible light emitted from the liquid crystal display can be reflected by the second object T2. The reflected visible light is incident to and detected by the visible ray sensor TrV positioned in the upper panel 200. Accordingly, the image sensing for the second object T2 can be executed, and thereby the image information for the second object T2 such as the shape, the size, and the color may be obtained.

After confirming the contact portion of the second object T2 through the touch sensing, the gray of the visible light emitted from the liquid crystal display toward the contact portion may be selectively changed such that the image sensing for the second object T2 may be further effectively executed. For example, when the gray of the visible light emitted from the liquid crystal display is darker than the gray of the visible ray incident to the liquid crystal display from the outside, the touch sensing using the infrared rays may firstly be executed. The gray of the visible rays emitted from the liquid crystal display toward the contact portion of the second object T2 recognized through the touch sensing can be selectively brightened such that effective image sensing of the second object T2 can be achieved.

Figure 9:
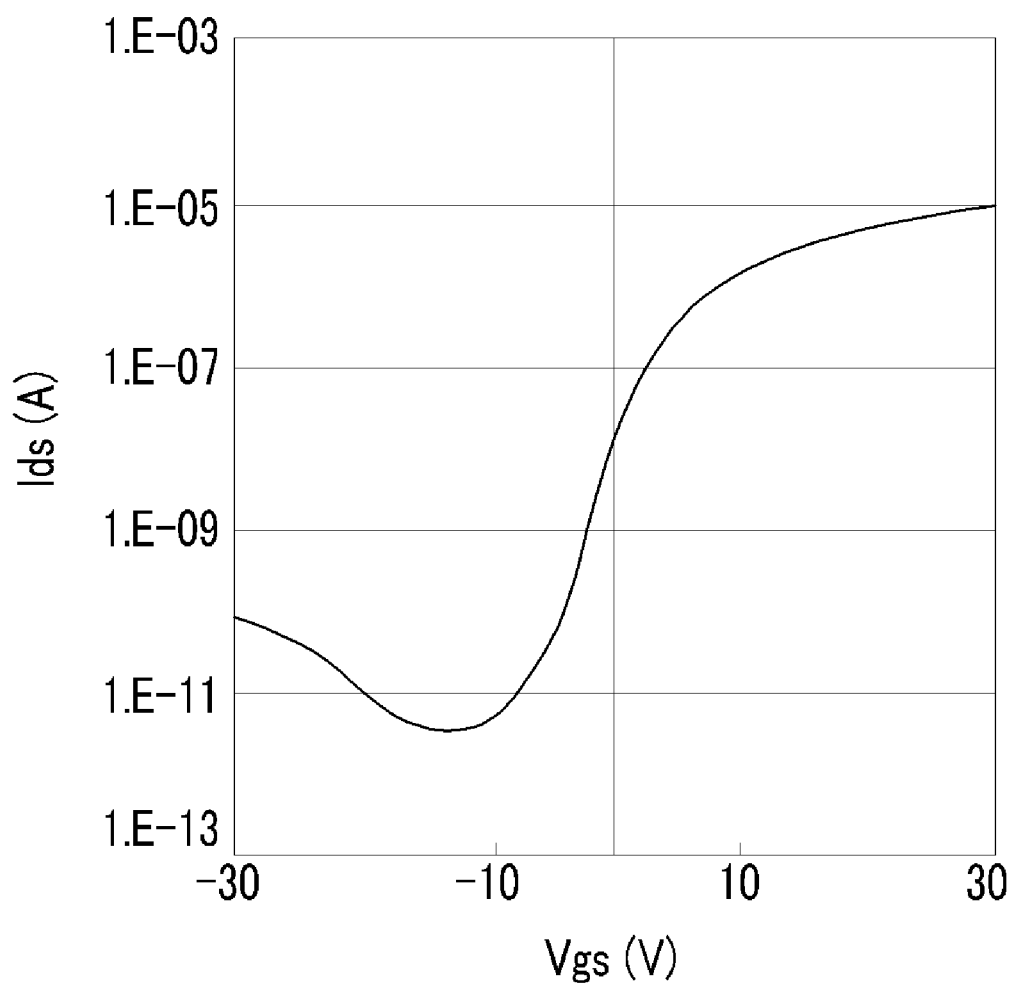
FIG. 9 is a graph depicting a relationship between Ids-Vgs in a bottom gate transistor in which a gate electrode is formed under a semiconductor layer in which the semiconductor layer is made of amorphous silicon.
Figure 10:
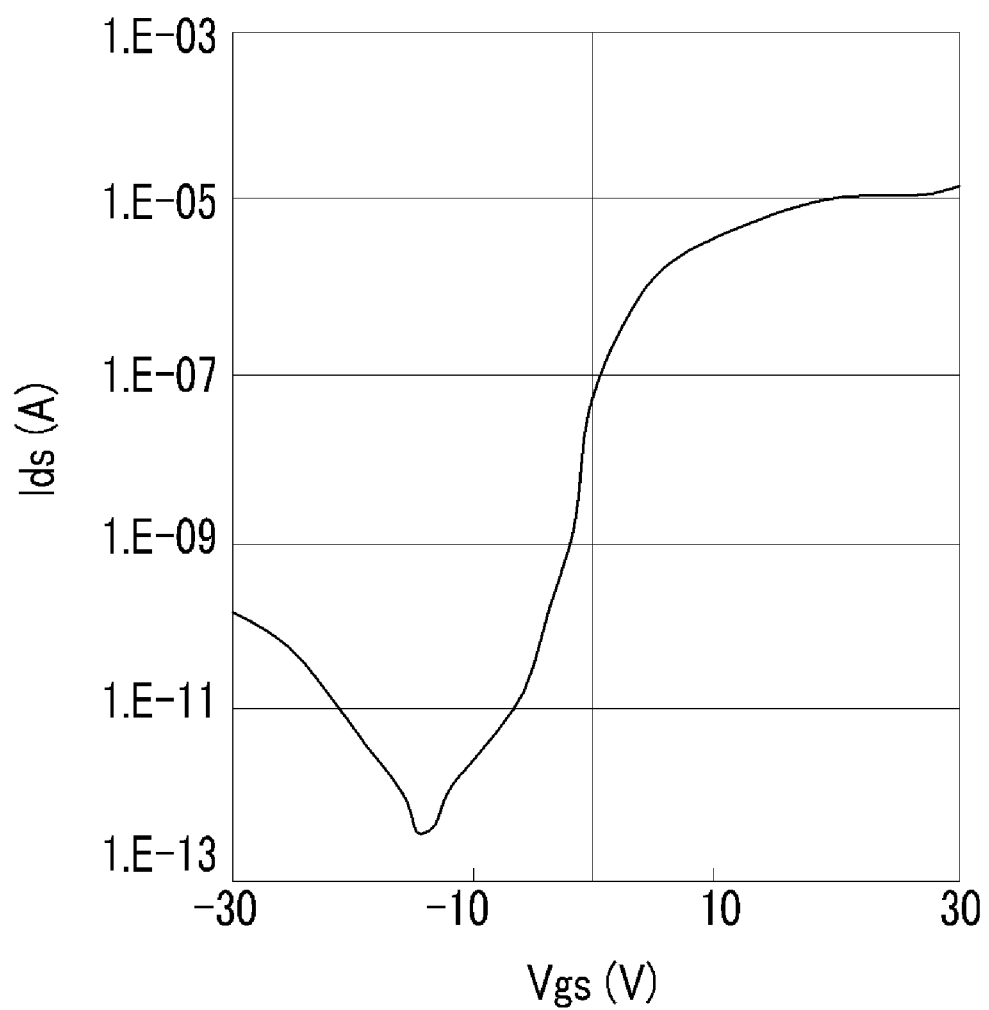
FIG. 10 is a graph depicting a relationship between Ids-Vgs in a double gate transistor in which a gate electrode is simultaneously formed on and under a semiconductor layer in which the semiconductor layer is made of amorphous silicon.
Figure 11:
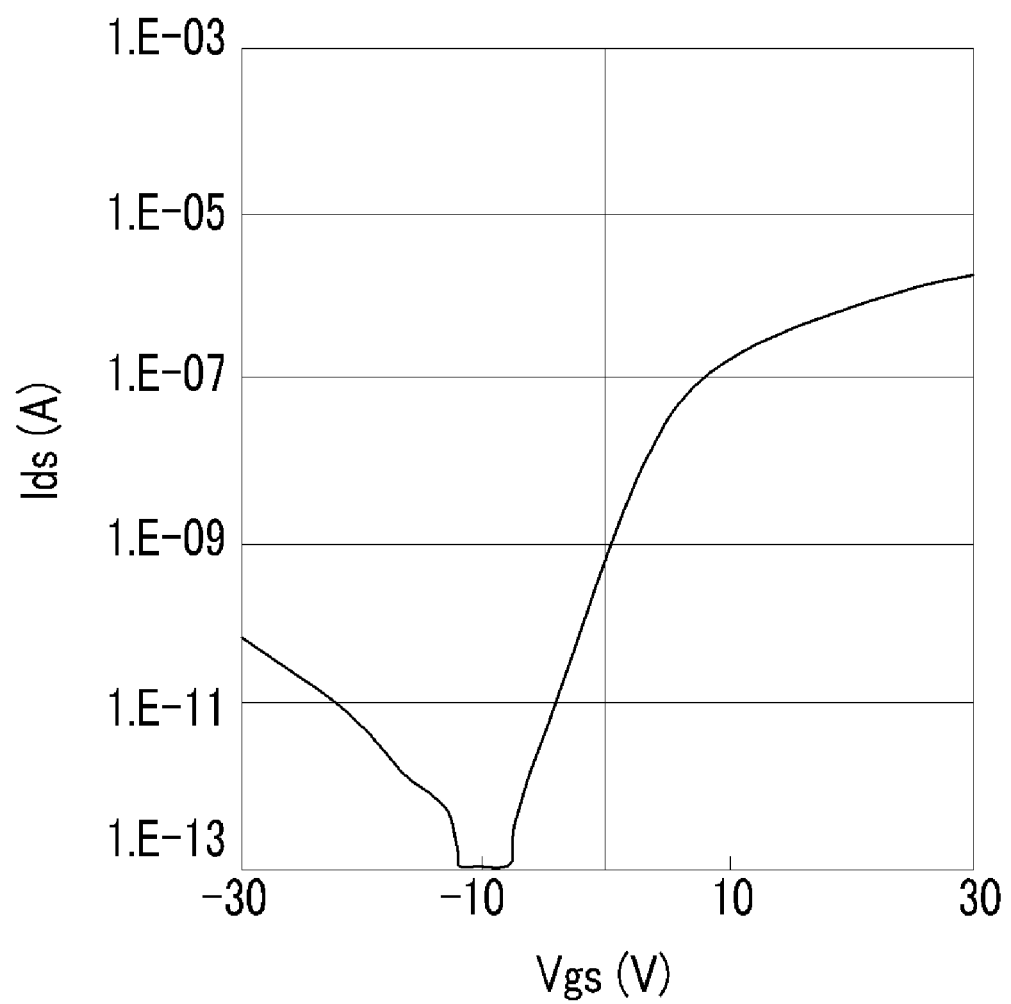
FIG. 11 is a graph depicting a relationship between Ids-Vgs in a double gate transistor in which a gate electrode is simultaneously formed on and under a semiconductor layer in which the semiconductor layer is made of amorphous silicon or silicon-germanium.
Figure 12:
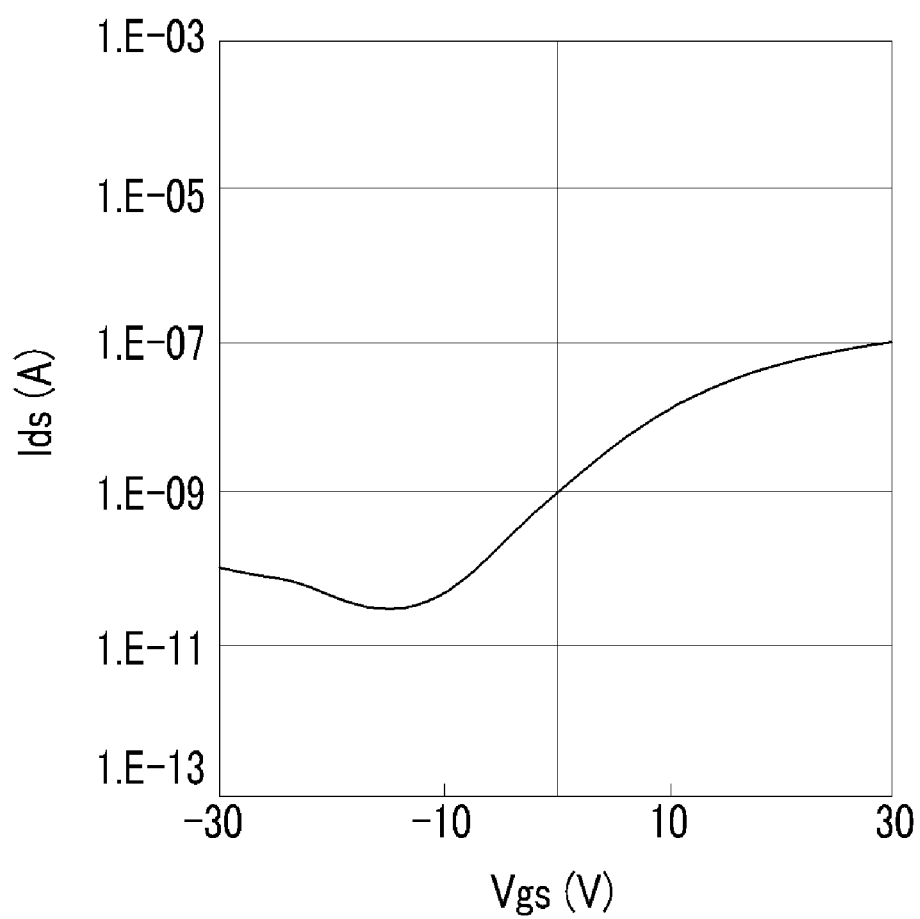
FIG. 12 is a graph depicting a relationship between Ids-Vgs in a top gate transistor of a planar type in which a source electrode and a drain electrode can be formed between the semiconductor layer and the gate electrode in which a semiconductor layer is made of amorphous silicon or silicon-germanium.

FIG. 9 is a graph depicting a relationship between Ids-Vgs in a bottom gate transistor in which a gate electrode is formed under a semiconductor layer in a case in which the semiconductor layer is made of amorphous silicon, FIG. 10 is a graph depicting a relationship between Ids-Vgs in a double gate transistor in which a gate electrode is simultaneously formed on and under a semiconductor layer in which the semiconductor layer can be made of amorphous silicon, FIG. 11 is a graph depicting a relationship between Ids-Vgs in a double gate transistor in which a gate electrode is simultaneously formed on and under a semiconductor layer in a case in which the semiconductor layer is made of amorphous silicon or silicon-germanium, and FIG. 12 is a graph depicting a relationship between Ids-Vgs in a top gate transistor of a planar type in which a source electrode and a drain electrode can be formed between the semiconductor layer and the gate electrode in which the semiconductor layer is made of amorphous silicon or silicon-germanium.

As shown in FIG. 9 and FIG. 10, a double gate transistor has an improved Ion characteristic compared to that of the bottom gate transistor.

Also, as shown in FIG. 9 and FIG. 11, when the double gate transistor has the semiconductor layer of amorphous silicon-germanium, it may be observed that the Ion characteristic can be decreased.

Also, as shown in FIG. 11, in an example of the double gate type situation, the upper gate electrode and the lower gate electrode are in synchronized state such that the electrons can largely be generated in the lower channel of the semiconductor layer such that the Ion characteristic can be improved, however, as shown in FIG. 12, in an example of the top gate situation, the electrons cannot largely be generated in the lower channel of the semiconductor layer such that the Ion characteristic can be decreased.

Accordingly, to improve the Ion and Ioff characteristics, when the semiconductor layer is made of amorphous silicon, it may be observed that the double gate transistor may be appropriate.

As described above, in exemplary embodiments of the present invention, the infrared ray sensing transistor may have the semiconductor layer made of amorphous silicon-germanium or amorphous germanium, and the visible ray sensing transistor and the readout transistor include the semiconductor layer made of amorphous silicon such that the infrared ray sensitivity of the infrared ray sensing transistor may be improved, and the processing speed of the readout transistor may be simultaneously improved while the visible ray sensitivity of the visible ray sensing transistor also can be improved, and thereby the transistor may be appropriate to be used for the objects of the infrared ray sensing, the visible ray sensing, and the control thereof.

Figure 13:
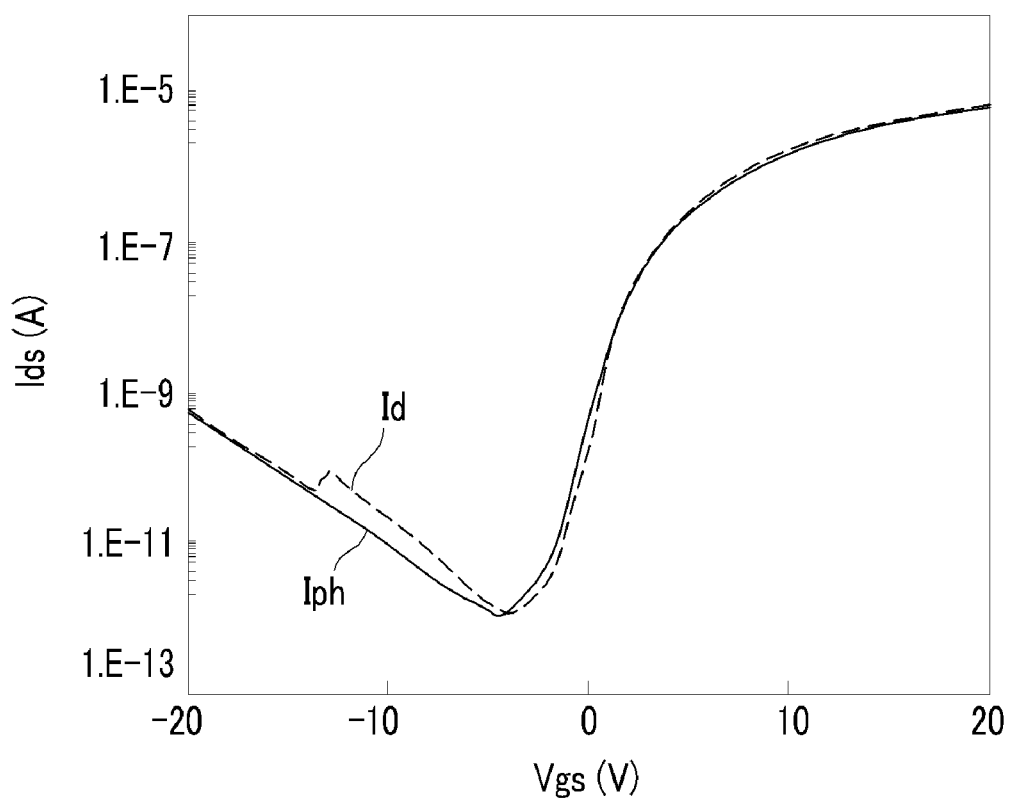
FIG. 13 is a graph depicting a relationship between Ids-Vgs of a readout transistor that can be implemented according to exemplary embodiments of the present invention.

FIG. 13 is a graph depicting a relationship between Ids-Vgs of a readout transistor that can be implemented according to exemplary embodiments of the present invention.

As shown in FIG. 13, the current Iph flowing in the readout transistor exposed to the visible rays may have the same characteristic as the current Id flowing in the readout transistor that cannot be exposed to the visible rays.

Figure 14:
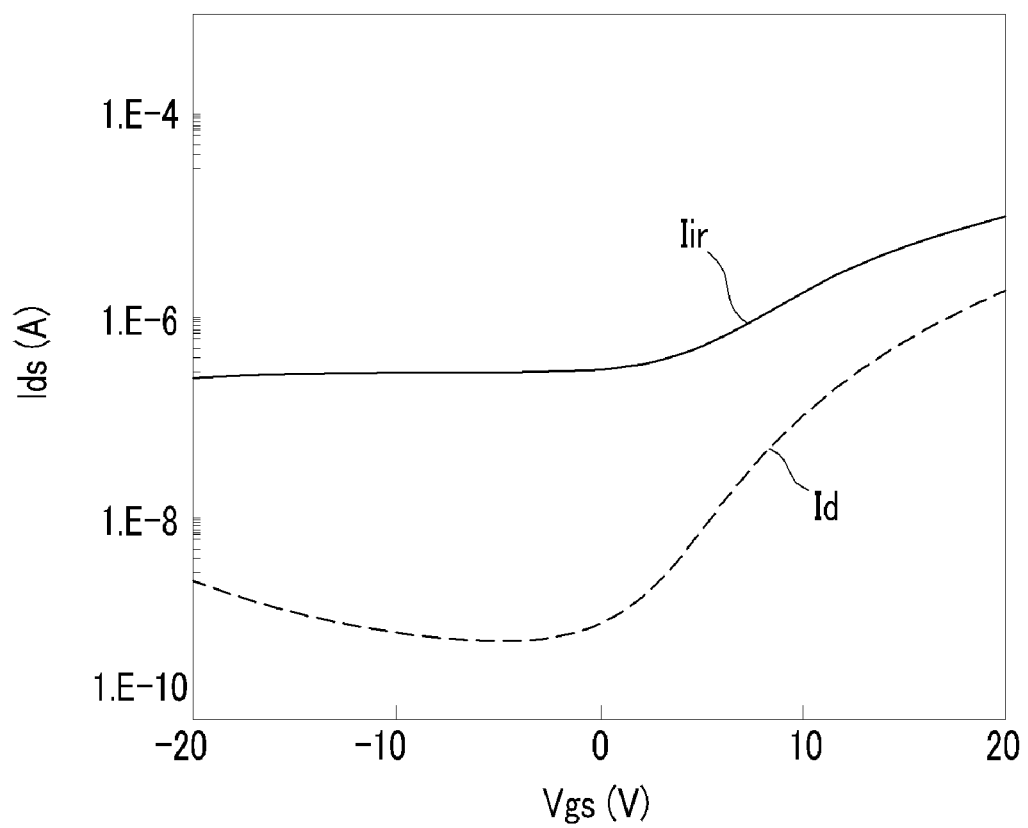
FIG. 14 is a graph depicting measurement of infrared ray sensitivity of an infrared ray sensing transistor in which a blocking insulating layer is formed with a thickness of approximately 500 Å and a semiconductor layer made of amorphous silicon-germanium is formed with a thickness of approximately 6000 Å that can be implemented according to exemplary embodiments of the present invention.

FIG. 14 is a graph depicting measurement of infrared ray sensitivity of an infrared ray sensing transistor in a case in which a blocking insulating layer is formed with a thickness of approximately 500 Å and a semiconductor layer made of amorphous silicon-germanium is formed with a thickness of approximately 6000 Å, that can be implemented according to exemplary embodiments of the present invention.

As shown in FIG. 14, when the transistor including the semiconductor layer made of amorphous silicon-germanium is exposed to the infrared rays, the ratio of the current Iir, generated by the reaction to the infrared rays when the transistor is exposed to the infrared rays for the current Id, is large such that the infrared ray sensitivity may be improved.

FIG. 15, FIG. 16, FIG. 17 and FIG. 18 are cross-sectional views sequentially showing a manufacturing method of a display device shown in FIG. 2. A manufacturing method of the display device of FIG. 2 will be described with reference to FIG. 2 and FIG. 15, FIG. 16, FIG. 17 and FIG. 18.

Figure 15:
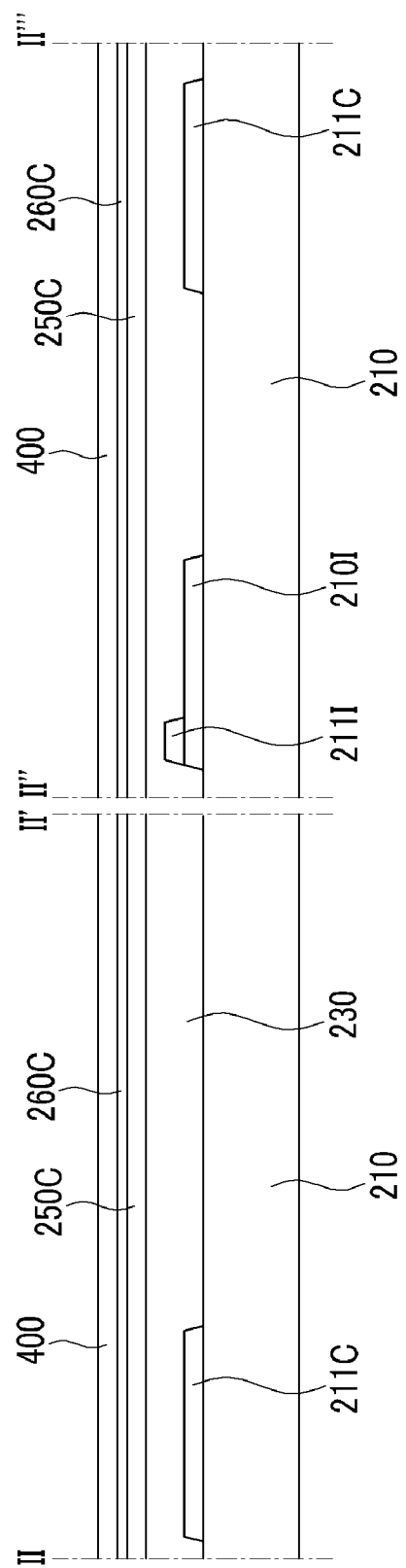
FIG. 15, FIG. 16, FIG. 17 and FIG. 18 are cross-sectional views sequentially illustrating a manufacturing method of a display device of FIG. 2.

As shown in FIG. 15, a light blocking film 210I made of an organic material or amorphous silicon including black pigments can be formed on a substrate 210. A lower gate electrode 211I is formed on the light blocking film 210I, and a lower gate electrode 211C can be formed on the substrate 210.

A blocking insulating layer 230 made of an insulating material such as silicon nitride and covering the substrate 210, the light blocking film 210I, and the lower gate electrodes 211I and 211C can be formed. A semiconductor material 250C, an ohmic contact material 260C, and an etching preventing material 400 can sequentially be formed on the blocking insulating layer 230. In this example, the semiconductor material 250C may be made of amorphous silicon, and the etching preventing material 400 may include one selected from Mo, Cr, MoAlMo, MOAl, IZO, or ITO.

Figure 16:
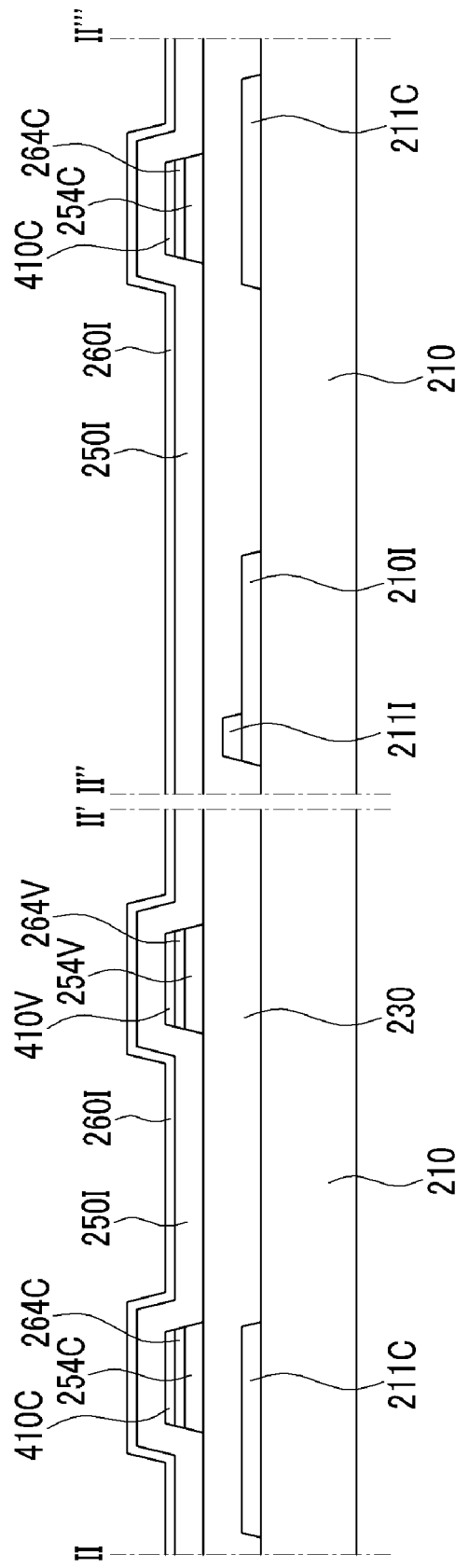

As shown in FIG. 16, the semiconductor material 250C, the ohmic contact material 260C, and the etching preventing material 400 can be etched to form a semiconductor layer 254V of a visible ray sensing transistor, an ohmic contact layer 264V, and an etching preventing layer 410V, and a semiconductor layer 254C of a readout transistor, an ohmic contact layer 264C, and an etching preventing layer 410C. Here, it is observed that the semiconductor layer 254C can be formed at a position overlapping the lower gate electrode 211C. Also, a semiconductor material 250I and an ohmic contact material 260I can sequentially be formed on the blocking insulating layer 230 and the etching preventing layers 410V and 410C. For example, the semiconductor material 250I may be made of amorphous silicon-germanium or amorphous germanium.

Figure 17:
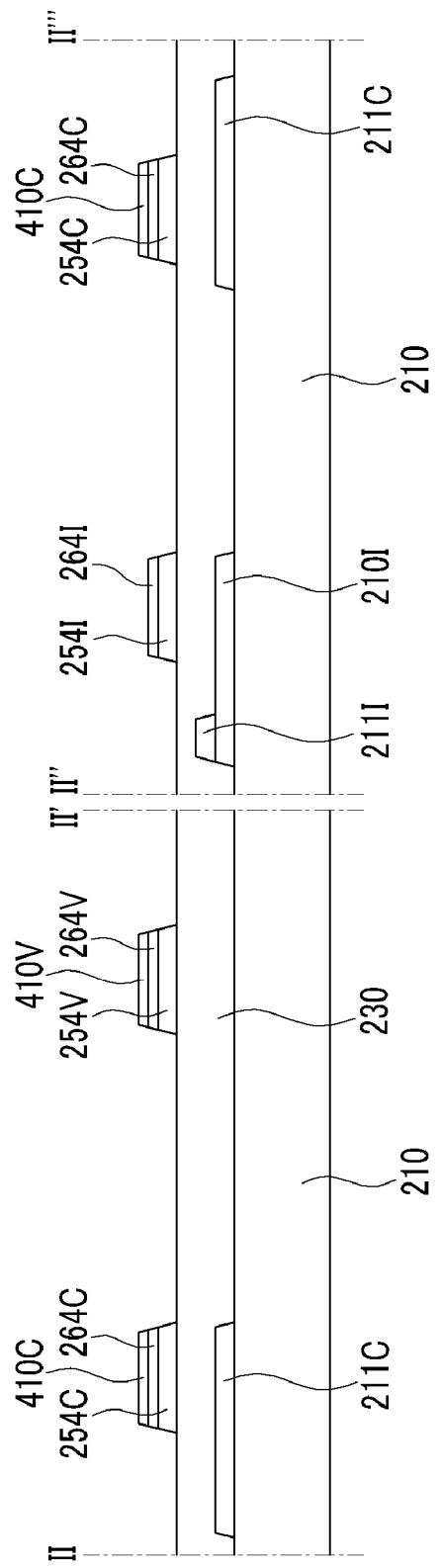

Next, as shown in FIG. 17, the semiconductor material 250I and the ohmic contact material 260I can be etched to form a semiconductor layer 254I and an ohmic contact layer 264I of the infrared ray sensing transistor. Here, it is contemplated that the semiconductor layer 254I can be formed at a position overlapping the light blocking film 210I. In this example, the etching preventing layer 410V can be formed on the semiconductor layer 254V and the ohmic contact layer 264V of the visible ray sensing transistor, and the etching preventing layer 410C can be formed on the semiconductor layer 254C and the ohmic contact layer 264C of the readout transistor, such that the semiconductor layers 254V and 254C cannot be damaged. The etching preventing layers 410V and 410C may be removed, for example, following the step forming the semiconductor layer 254I and the ohmic contact layer 264I of the infrared ray sensing transistor.

Figure 18:
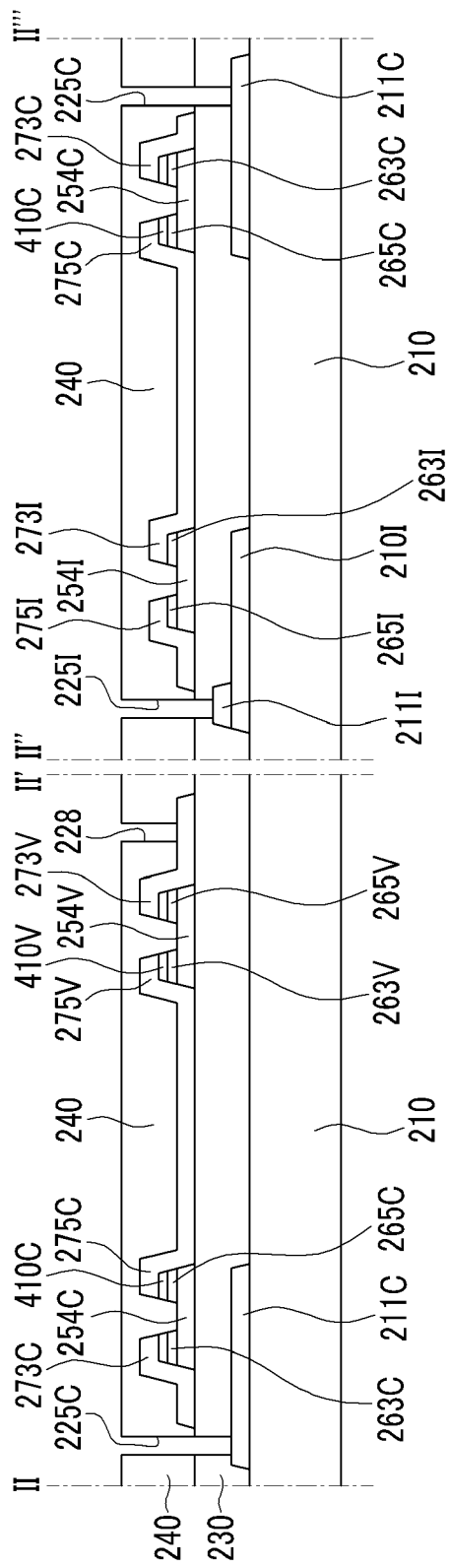

As shown in FIG. 18, source electrodes 273V, 273I, and 273C, and drain electrodes 275V, 275I, and 275C can be formed on the blocking insulating layer 230, the etching preventing layers 410V and 410C, and the ohmic contact layers 264V, 264I, and 264C. Also, the etching preventing layers 410V and 410C and the ohmic contact layers 264V, 264I, and 264C that can be exposed between the source electrodes 273V, 273I, and 273C and the drain electrodes 275V, 275I, and 275C can be etched to complete ohmic contact layers 263V, 265V, 263I, 265I, 263C, and 265C that are separated from each other. Further, a gate insulating layer 240 covering the source electrodes 273V, 273I, and 273C and the drain electrode 275V, 275I, and 275C can be formed. Also, the gate insulating layer 240 and the blocking insulating layer 230 can be etched to form contact holes 225C and 225I exposing the lower gate electrodes 211C and 211I, and a contact hole 228 exposing the drain electrode 275V.

As shown in FIG. 2, upper gate electrodes 224V, 224I, and 224C and a storage electrode 227 can be formed on the gate insulating layer 240. The upper gate electrodes 224V, 224I, and 224C can be formed at a position overlapping the semiconductor layers 254V, 254I, and 254C, and can be connected to the lower gate electrodes 211I and 211C through the contact holes 225I and 225C. Also, the storage electrode 227 can be connected to the drain electrode 275V through the contact hole 228. A passivation layer 280 can be formed on the upper gate electrodes 224V, 224I, and 224C and the storage electrode 227.

Figure 19:
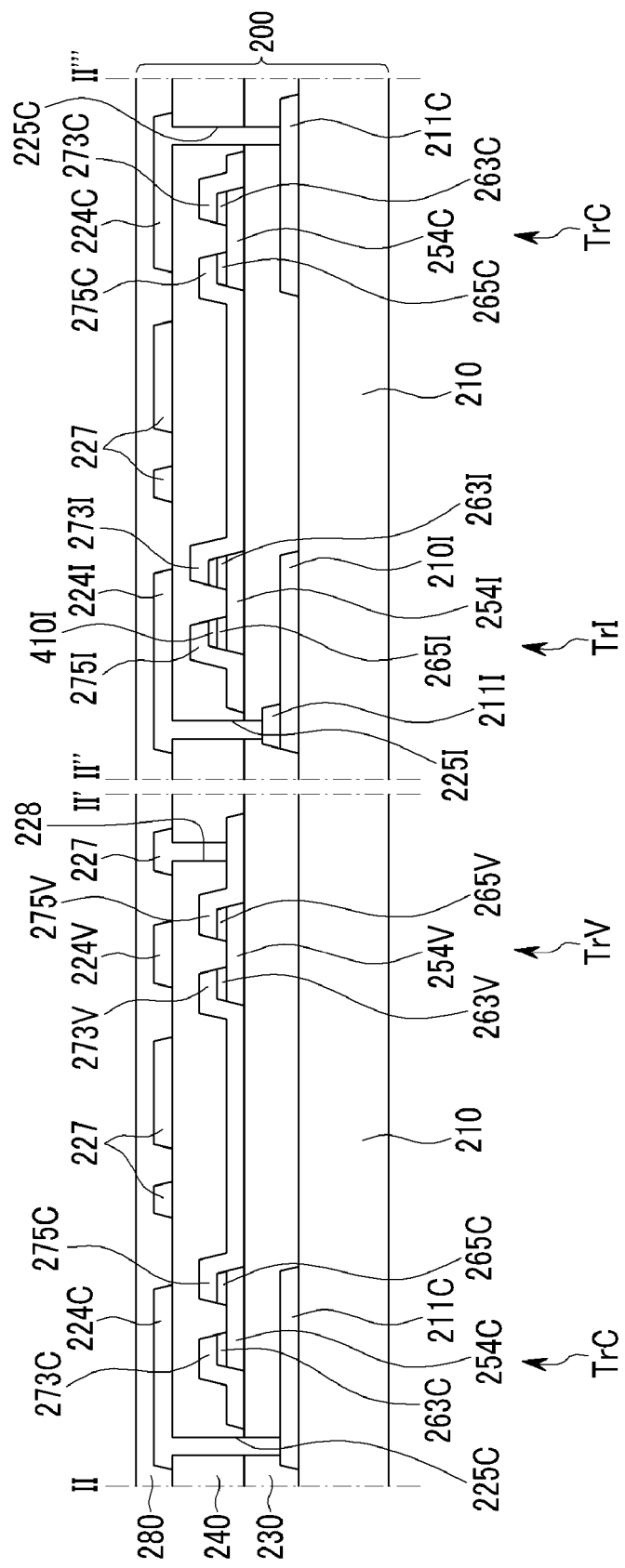
FIG. 19 is a cross-sectional view of an upper panel of a display device, according to exemplary embodiments of the present invention.

FIG. 19 is a cross-sectional view of an upper panel of a display device, according to exemplary embodiments of the present invention.

FIG. 19 may have common features of exemplary embodiments shown in FIG. 2 except for the etching preventing layer, such that repeated descriptions may be omitted.

An etching preventing layer 410I may be formed between the ohmic contact layer 263I and the source electrode 273I, and the ohmic contact layer 265I and the drain electrode 275I, of the infrared ray sensing transistor TrI. To prevent damage to the semiconductor layer 254I of the infrared ray sensing transistor TrI when forming the semiconductor layer 254C of the readout transistor TrC, the etching preventing layer 410I may be formed on the ohmic contact layers 263I and 265I on the semiconductor layer 254I. The etching preventing layer 410I may include one selected from Mo, Cr, MoAlMo, MoAl, IZO, or ITO.

FIG. 20, FIG. 21, FIG. 22 and FIG. 23 are cross-sectional views sequentially illustrating a manufacturing method of a display device of FIG. 19. A manufacturing method of the display device shown in FIG. 19 will be described with reference to FIG. 19, FIG. 20, FIG. 21, FIG. 22 and FIG. 23.

The manufacturing method of the display device in FIG. 19 may have common features of the manufacturing method of the display device of FIG. 2 shown in FIG. 15, FIG. 16, FIG. 17 and FIG. 18 except for the step of forming the etching preventing layer, such that repeated descriptions may be omitted.

Figure 20:
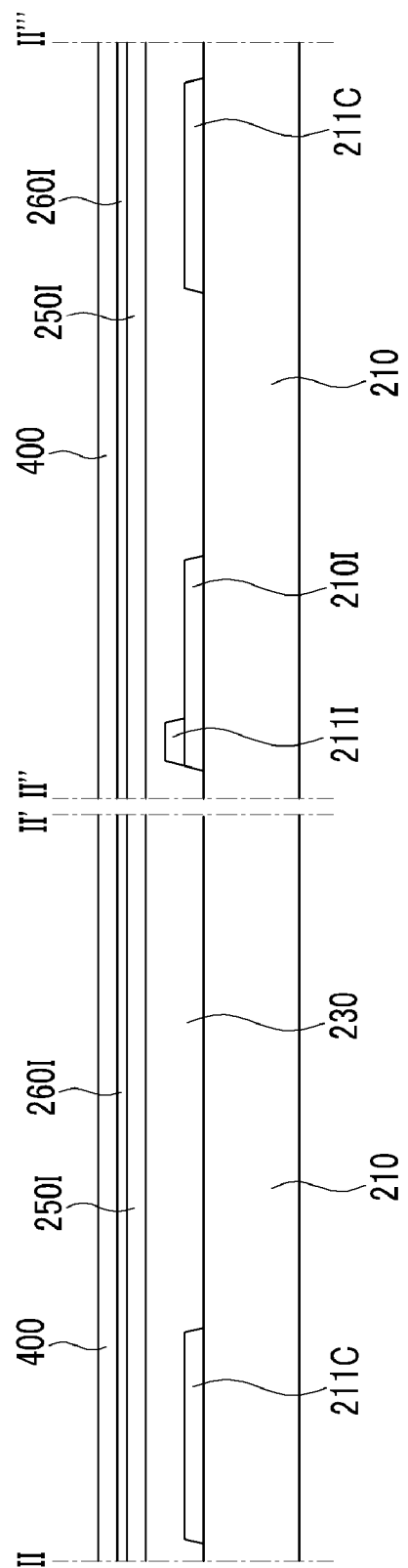
FIG. 20, FIG. 21, FIG. 22 and FIG. 23 are cross-sectional views sequentially illustrating a manufacturing method of a display device of FIG. 19.

As shown in FIG. 20, a semiconductor material 250I, an ohmic contact material 260I, and an etching preventing material 400 can be formed on the blocking insulating layer 230. In this example, the semiconductor material 250I may include amorphous silicon-germanium or amorphous germanium.

Figure 21:
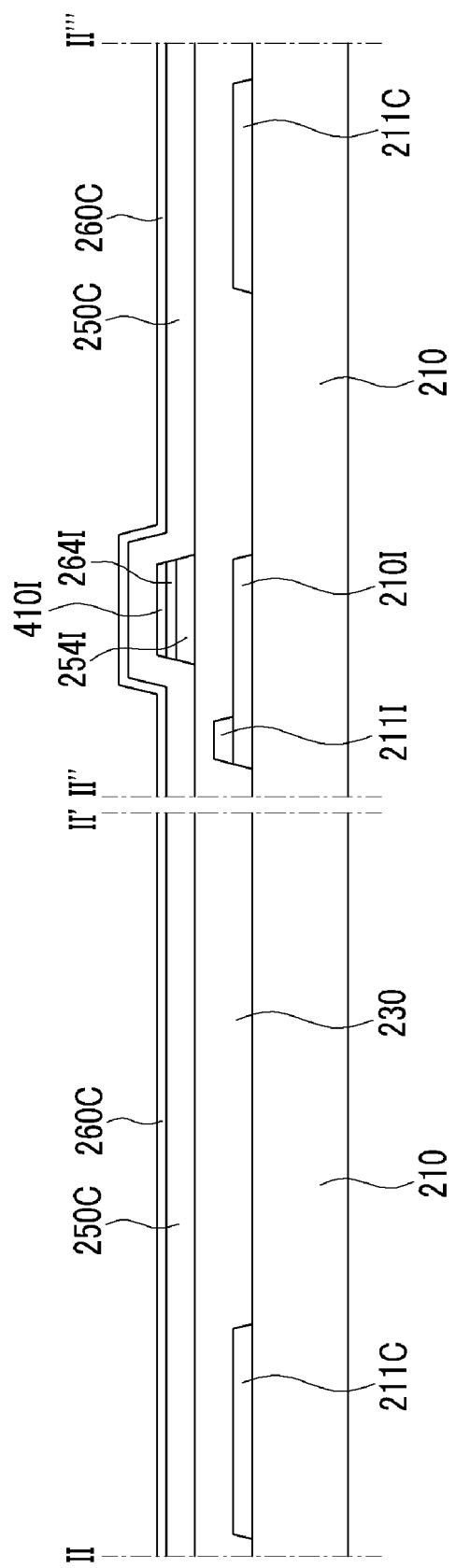

As shown in FIG. 21, the semiconductor material 250I, the ohmic contact material 260I, and the etching preventing material 400 can be etched to form a semiconductor layer 254I, an ohmic contact layer 264I, and an etching preventing layer 410I of the infrared ray sensing transistor. Also, a semiconductor material 250C and an ohmic contact material 260C can be sequentially formed on the blocking insulating layer 230 and the etching preventing layer 410I. In this example, the semiconductor material 250C may be made of amorphous silicon.

Figure 22:
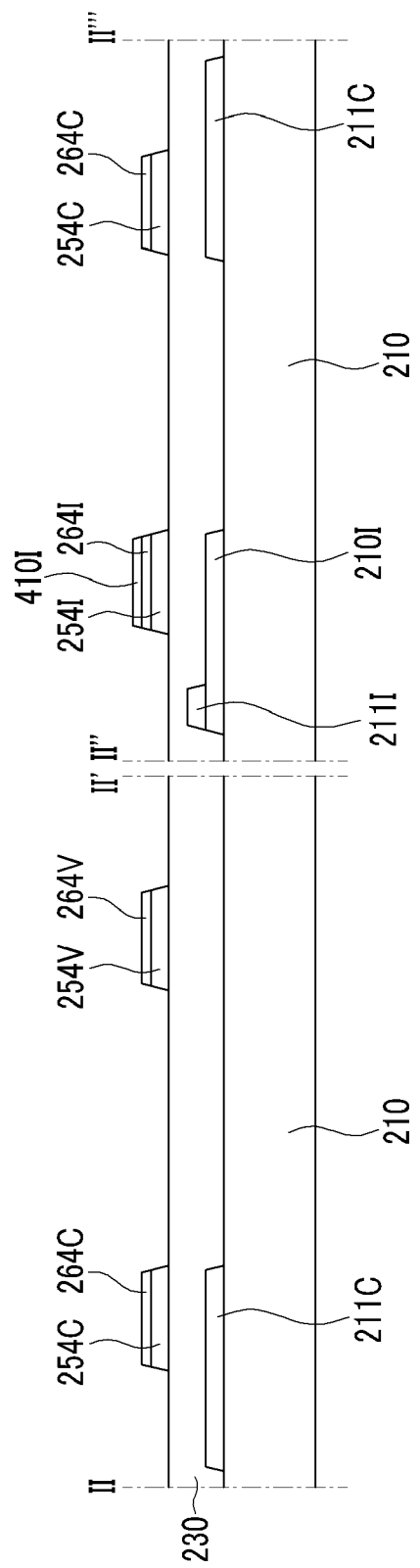

As shown in FIG. 22, the semiconductor material 250C and the ohmic contact material 260C can be etched to form a semiconductor layer 254C and an ohmic contact layer 264C of the visible ray sensing transistor, and a semiconductor layer 254V and an ohmic contact layer 264V of the readout transistor. In this example, an etching preventing layer 410I can be formed on the ohmic contact layer 264I of the infrared ray sensing transistor such that the semiconductor layer 254I cannot be damaged. The etching preventing layer 410I may be additionally removed following the present step of forming the semiconductor layers 254C and 254V and the ohmic contact layers 264C and 264V of the readout transistor and the visible ray sensing transistor.

Figure 23:
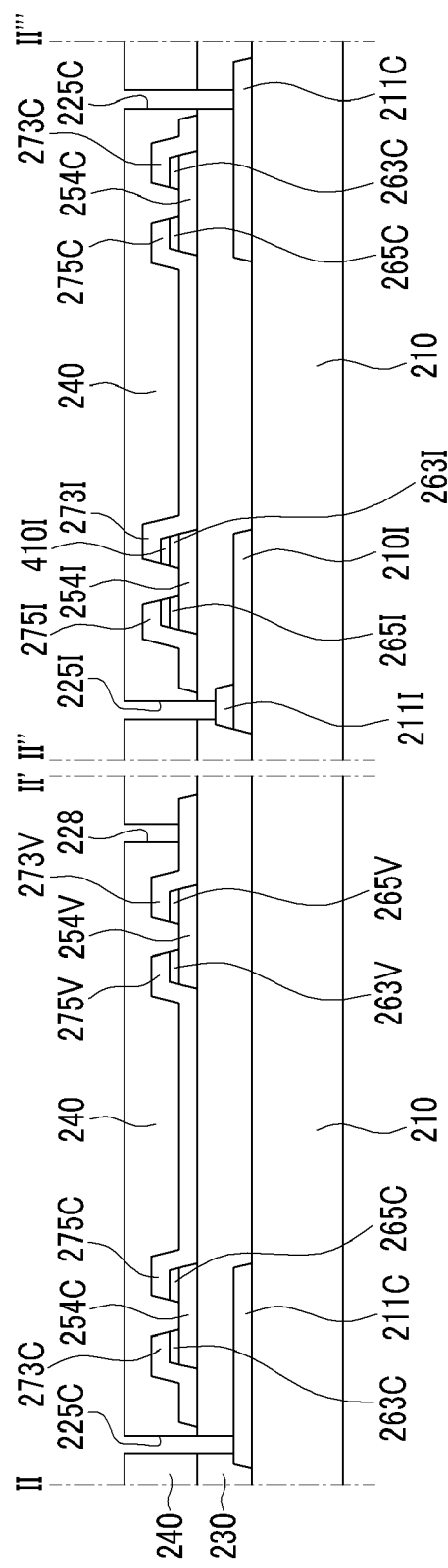

As shown in FIG. 23, source electrodes 273V, 273I, and 273C and drain electrodes 275V, 275I, and 275C can be formed on the blocking insulating layer 230, the etching preventing layer 410I, and the ohmic contact layers 264C and 264V. Also, the etching preventing layer 410I and the ohmic contact layers 264V, 264I, and 264C that are exposed between the source electrodes 273V, 273I, and 273C and the drain electrodes 275V, 275I, and 275C are etched to form ohmic contact layers 263V, 265V, 263I, 265I, 263C, and 265C that are separated from each other. Further, a gate insulating layer 240 covering the source electrodes 273V, 273I, and 273C and the drain electrodes 275V, 275I, and 275C can be formed. The gate insulating layer 240 and the blocking insulating layer 230 can be etched to form contact holes 225C and 225I exposing the lower gate electrodes 211C and 211I, and a contact hole 228 exposing the drain electrode 275V.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
a panel comprising an upper substrate and a lower substrate, and a pixel transistor formed on the lower substrate, wherein
the upper substrate is facing the lower substrate and an infrared ray sensing transistor and a readout transistor being connected to the infrared ray sensing transistor are provided on the upper substrate, and the readout transistor is provided to transmit a signal and wherein,
the readout transistor comprises a first lower gate electrode formed on the upper substrate, a first semiconductor layer overlapping the first lower gate electrode and formed on the first lower gate electrode, and a first source electrode and a first drain electrode formed on the first semiconductor layer and wherein,
the infrared ray sensing transistor comprises a light blocking film and a second lower gate electrode formed on the upper substrate, the second lower gate coupled to the light blocking film, a second semiconductor layer overlapping the light blocking film formed on the second lower gate electrode, a second source electrode and a second drain electrode formed on the second semiconductor layer, and a second upper gate electrode overlapping the second semiconductor layer formed on the second source electrode and the second drain electrode.

2. The display device of claim 1, further comprising:
a first upper gate electrode overlapping the first semiconductor layer formed on the first source electrode and the first drain electrode.

3. The display device of claim 1, further comprising
a first etching preventing layer formed between the first semiconductor layer, and the first source electrode and the first drain electrode.

4. The display device of claim 3, wherein
the first etching preventing layer comprises one selected from Mo, Cr, MoAlMo, MoAl, IZO, or ITO.

5. The display device of claim 1, wherein
the light blocking film is connected to the second upper gate electrode through the second lower gate electrode.

6. The display device of claim 1, wherein
the thickness of the second semiconductor layer is in the range of about 3000 Å to 10,000 Å.

7. The display device of claim 1, further comprising
a blocking insulating layer formed between the light blocking film and the second semiconductor layer and having a thickness of approximately 3000 Å to approximately 10,000 Å.

8. The display device of claim 1, further comprising
a gate insulating layer formed between the second semiconductor layer and the second upper gate electrode and having a thickness of approximately 3000 Å to approximately 10,000 Å.

9. The display device of claim 1, further comprising
a visible ray sensing transistor formed on the upper substrate and connected to the readout transistor,
wherein the visible ray sensing transistor comprises a third semiconductor layer positioned on the upper substrate and comprising amorphous silicon, a third source electrode and a third drain electrode positioned on the third semiconductor layer, and a third upper gate electrode overlapping the third semiconductor layer on the third source electrode and the third drain electrode.

10. The display device of claim 2, further comprising:
a second etching preventing layer formed between the second semiconductor layer, and the second source electrode and the second drain electrode.

* * * * *